United States Patent
Takahashi et al.

(10) Patent No.: US 7,427,880 B2
(45) Date of Patent: Sep. 23, 2008

(54) SAMPLE/HOLD APPARATUS WITH SMALL-SIZED CAPACITOR AND ITS DRIVING METHOD

(75) Inventors: Masaharu Takahashi, Shiga (JP); Tadao Minami, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/195,778

(22) Filed: Aug. 3, 2005

(65) Prior Publication Data
US 2006/0028249 A1 Feb. 9, 2006

(30) Foreign Application Priority Data
Aug. 4, 2004 (JP) .............................. 2004-227622

(51) Int. Cl.
*G11C 27/02* (2006.01)
*H03K 5/00* (2006.01)
*H03K 17/00* (2006.01)
(52) U.S. Cl. ....................................................... 327/94
(58) Field of Classification Search .................. 327/91, 327/94, 337, 95; 341/122
See application file for complete search history.

(56) References Cited

U.S. PATENT DOCUMENTS

| | | | | |
|---|---|---|---|---|
| 4,823,027 A * | 4/1989 | Takahashi | ..................... | 327/94 |
| 5,517,140 A * | 5/1996 | Hatsuda | ....................... | 327/95 |
| 6,384,641 B1 * | 5/2002 | Kase | ............................ | 327/91 |
| 6,529,049 B2 * | 3/2003 | Erhart et al. | ................... | 327/94 |
| 6,654,469 B1 * | 11/2003 | Nelson et al. | .............. | 381/94.1 |

FOREIGN PATENT DOCUMENTS

| | | | | |
|---|---|---|---|---|
| JP | 04011399 A | * | 1/1992 | |
| JP | 05006688 A | * | 1/1993 | |
| JP | 07-262789 | | 10/1995 | |

* cited by examiner

*Primary Examiner*—Quan Tra
(74) *Attorney, Agent, or Firm*—Foley & Lardner LLP

(57) ABSTRACT

A sample/hold apparatus includes first, second and third power supply terminals to which first, second and third power supply voltages are applied. The second power supply voltage is an intermediate voltage between are first and third power supply voltages. A sampling switching element is adapted to pass an input voltage at an input terminal therethrough in response to a sample/hold voltage at a sample/hold terminal. A capacitor has a first terminal connected to an output of the sampling switching element and a second terminal connected to the second power supply terminal. A buffer amplifier is adapted to perform an impedance conversion upon a voltage at the first terminal of the capacitor to generate an output voltage at an output terminal. The buffer amplifier is powered by the first and third power supply voltages.

5 Claims, 8 Drawing Sheets

SAMPLE/HOLD APPARATUS WITH SMALL-SIZED CAPACITOR AND ITS DRIVING METHOD

BACKGROUND OF THE INVENTION

1. Field of the Invention

The present invention relates to a sample/hold apparatus and its driving method.

2. Description of the Related Art

A prior art sample/hold apparatus is constructed by a power supply terminal, a ground terminal, an input terminal, an output terminal, a sample/hold terminal, a sampling switching element adapted to pass an input voltage at the input terminal therethrough in response to a sample/hold voltage at the sample/hold terminal, a capacitor having a first terminal connected to an output of the sampling switching element and a second terminal connected to the ground terminal, and a buffer amplifier adapted to perform an impedance conversion upon a voltage at the first terminal of the capacitor to generate an output voltage at the output terminal. The buffer amplifier is powered by a power supply voltage at the power supply terminal and the ground voltage at the ground terminal (see: JP-7-262789-A). This will be explained later in detail.

In the above-described prior art sample/hold apparatus, however, if input voltage $V_{in}$ has a swing from 0V to $V_{DD}$, the maximum voltage applied to the capacitor is $V_{DD}$, so that the breakdown voltage of the capacitor needs to be higher than $V_{DD}$, which would increase the electrode area thereof. As a result, the above-described prior art sample/hold apparatus would be increased in size.

Particularly, if the above-described prior art sample/hold apparatus is incorporated into an integrated circuit such as a data line driver of a liquid crystal display (LCD) apparatus, including as many sample/hold circuits as the number of data lines, although shrinkage is required, since the electrode area of the capacitor of the sample/hold circuits depending upon the capacitance thereof could not be decreased, the shrinkage, i.e., the enhancement of integration could not be expected.

Generally, note that the occupied area of electrodes of capacitors is about 20 percent in one data line driver. Therefore, in order to enhance of the integration of the data line driver, the decrease of the occupied area of electrodes of such capacitors is indispensable.

SUMMARY OF THE INVENTION

It is an object of the present invention to provide a sample/hold apparatus capable of decreasing the occupied area of electrodes of a capacitor and its driving method.

Another object is to provide a data line driver including a plurality of sample/hold circuits whose occupied area can be decreased.

According to the present invention, a sample/hold apparatus includes first, second and third power supply terminals to which first, second and third power supply voltages are applied. The second power supply voltage is an intermediate voltage between the first and third power supply voltages. A sampling switching element is adapted to pass an input voltage at an input terminal therethrough in response to a sample/hold voltage at a sample/hold terminal. A capacitor has a first terminal connected to an output of the sampling switching element and a second terminal connected to the second power supply terminal. A buffer amplifier is adapted to perform an impedance conversion upon a voltage at the first terminal of the capacitor to generate an output voltage at an output terminal. The buffer amplifier is powered by the first and third power supply voltages.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Figure 4:
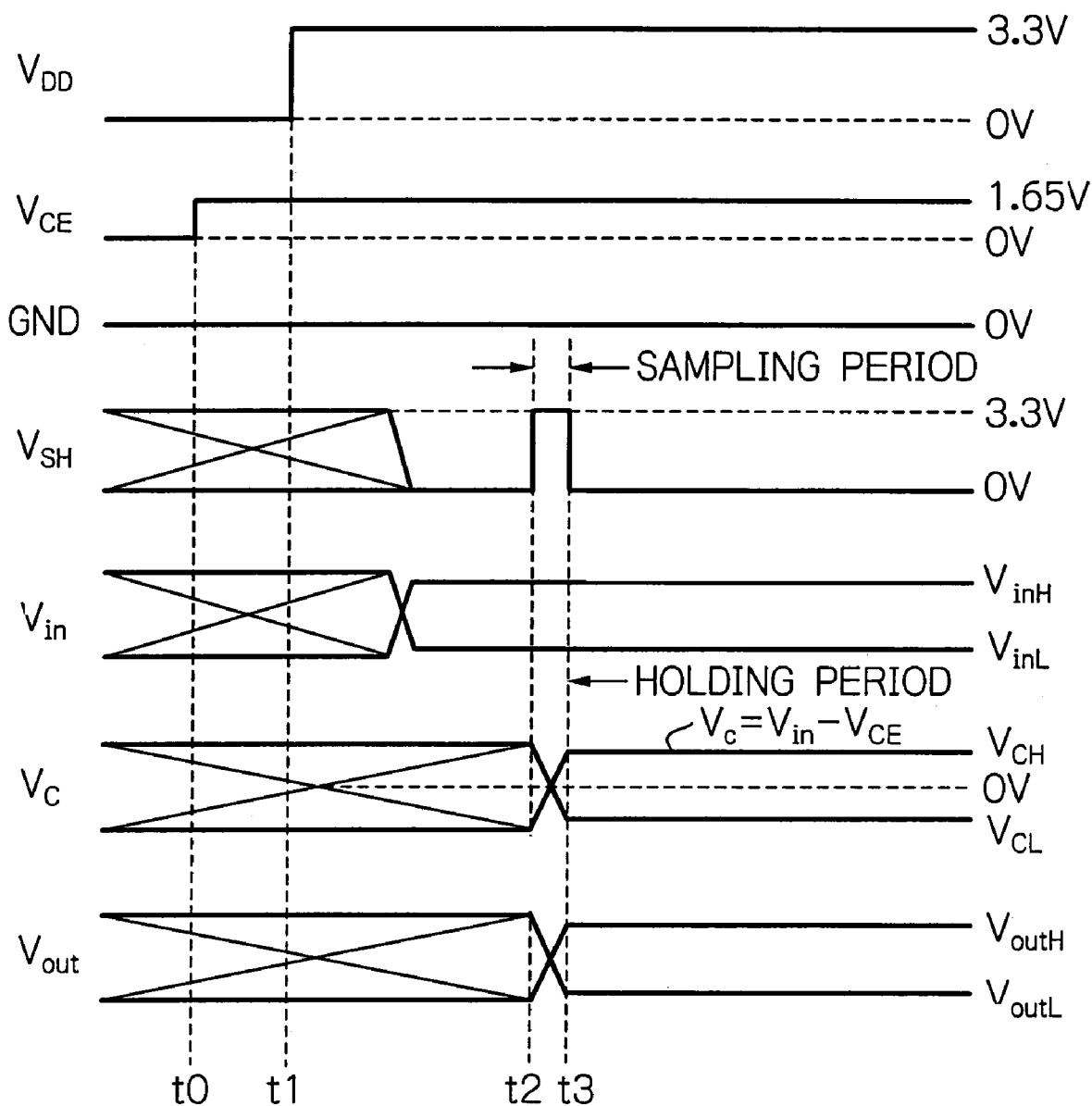
FIG. 4 is a timing diagram for explaining the operation of the sample/hold apparatus of FIG. 3.

Before the description of the preferred embodiments, a prior art sample/hold apparatus will be explained with reference to FIG. 1 (see: FIG. 4 of JP-7-262789-A).

Figure 1:
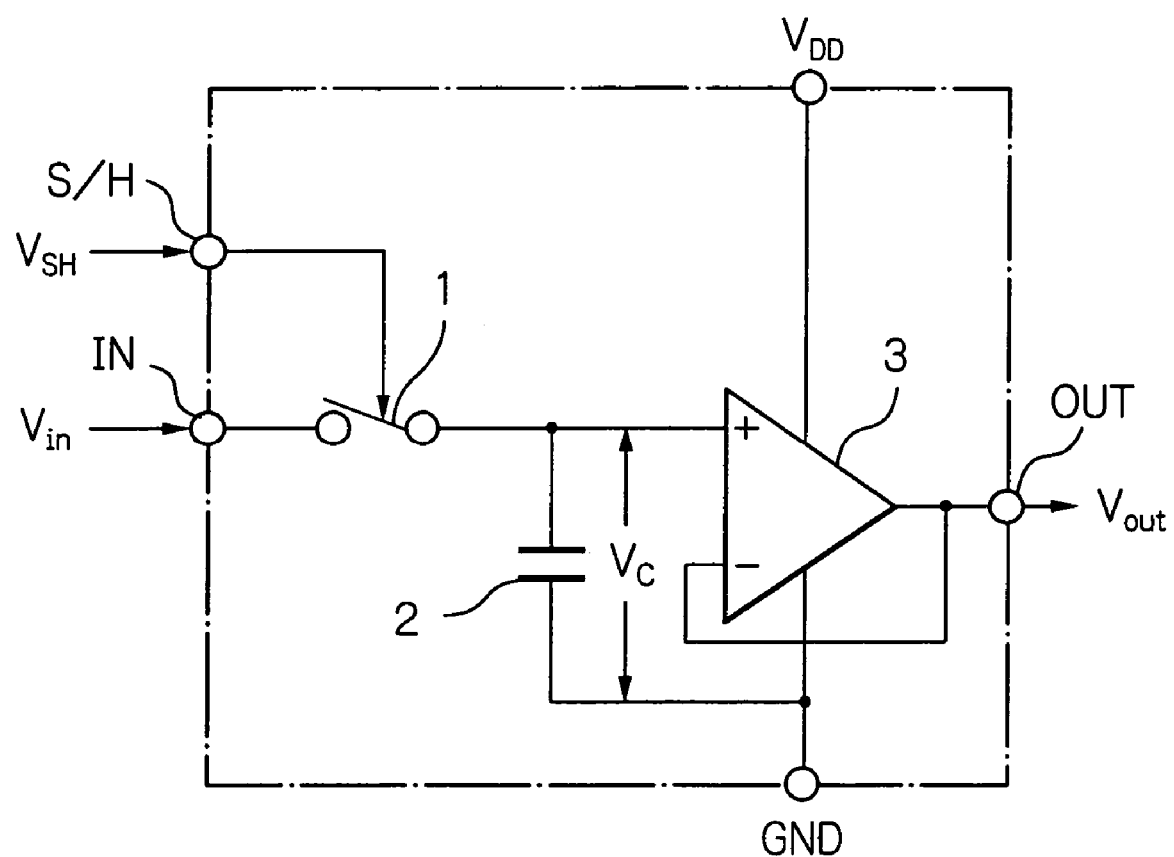
FIG. 1 is a circuit diagram illustrating a prior art sample/hold apparatus.

In FIG. 1, a power supply terminal $V_{DD}$, a ground terminal GND, an input terminal IN, an output terminal OUT, and a sample/bold terminal S/H are provided. A sampling switching element 1 passes an input voltage $V_{in}$ at the input terminal IN therethrough in response to a sample/hold voltage $V_{SH}$ at the sample/hold terminal S/H. A capacitor 2 has a terminal connected to the output of the sampling switching element 1 and another terminal connected to the ground terminal GND. A buffer amplifier 3 performs an impedance conversion upon a voltage $V_C$ at the capacitor 2 to generate an output voltage $V_{out}$ at the output terminal OUT. In this case, the buffer amplifier 3 is powered by the voltage at the power supply terminal $V_{DD}$ and the ground terminal GND.

Figure 5:
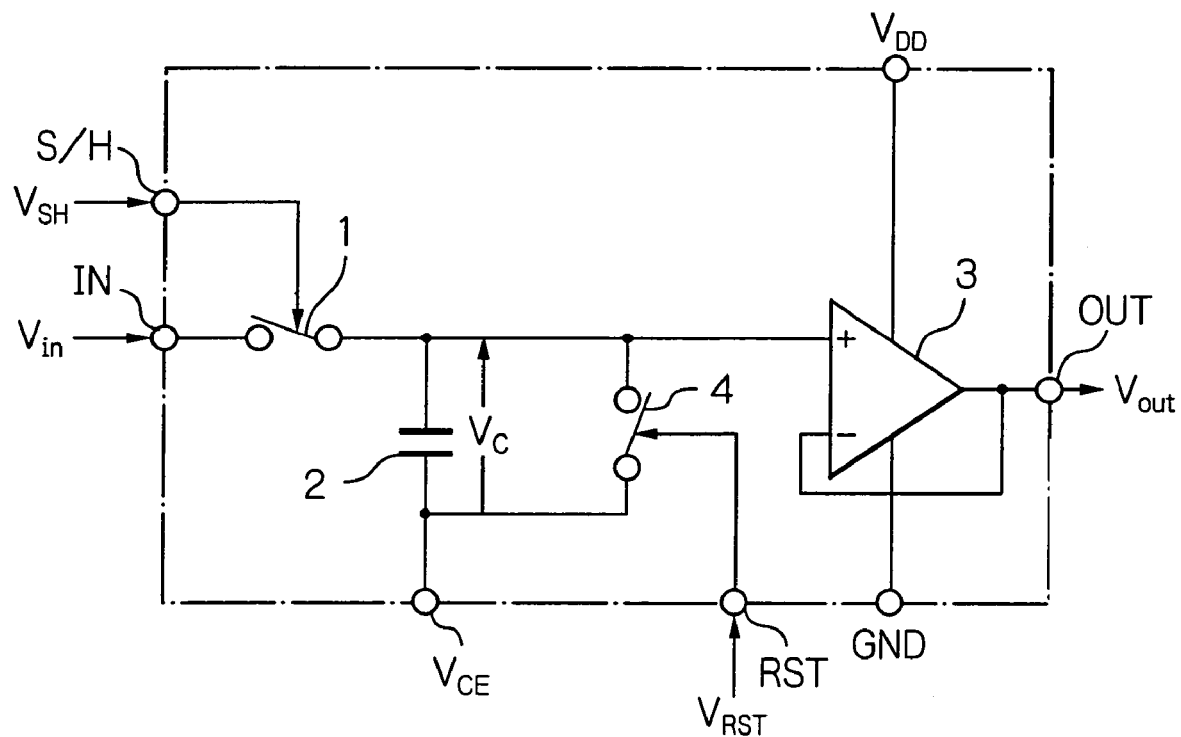
FIG. 5 is a circuit diagram illustrating a second embodiment of the sample/hold apparatus according to the present invention.

Note that the sampling switching element 1 and the buffer amplifier 3 can be constructed by MOS transistors (see: FIG. 5 of JP-7-262789).

The operation of the sample/hold apparatus of FIG. 1 is explained next with reference to FIG. 2.

First, at time t1, the voltage at the power supply terminal $V_{DD}$ is powered ON, i.e., $V_{DD}$=3.3V, for example.

Next, at time t2, the sample/hold voltage $V_{SH}$ is switched from low to high, thus entering a sampling period. That is, the sampling switching element 1 is turned ON, so that an input voltage $V_{in}$ is sampled by the capacitor 2 as a voltage $V_C$, i.e., $V_C = V_{in}$. Note that the input voltage $V_{in}$ is either $V_{inL}$ or $V_{inH}$ between 0V and 3.3V, and the voltage $V_C$ is either $V_{CL}$ or $V_{CH}$ between 0V and 3.3V corresponding to either $V_{inL}$ or $V_{inH}$. In addition, the voltage $V_C$ is supplied through the buffer amplifier 3 as an output voltage $V_{out}$ to the output terminal OUT. Note that the output voltage $V_{out}$ is either $V_{outL}$ or $V_{outH}$ between 0V and 3.3V corresponding to either $V_{CL}$ or $V_{CH}$.

Finally, at time t3, the sample/hold voltage $V_{SH}$ is switched from high to low, entering a holding period. That is, the sampling switching element 1 is turned OFF, so that the voltage $V_C$ is held in the capacitor 2. Thus, the buffer amplifier 3 continues to generate the output voltage $V_{out}$ at the output terminal OUT.

Figure 2:
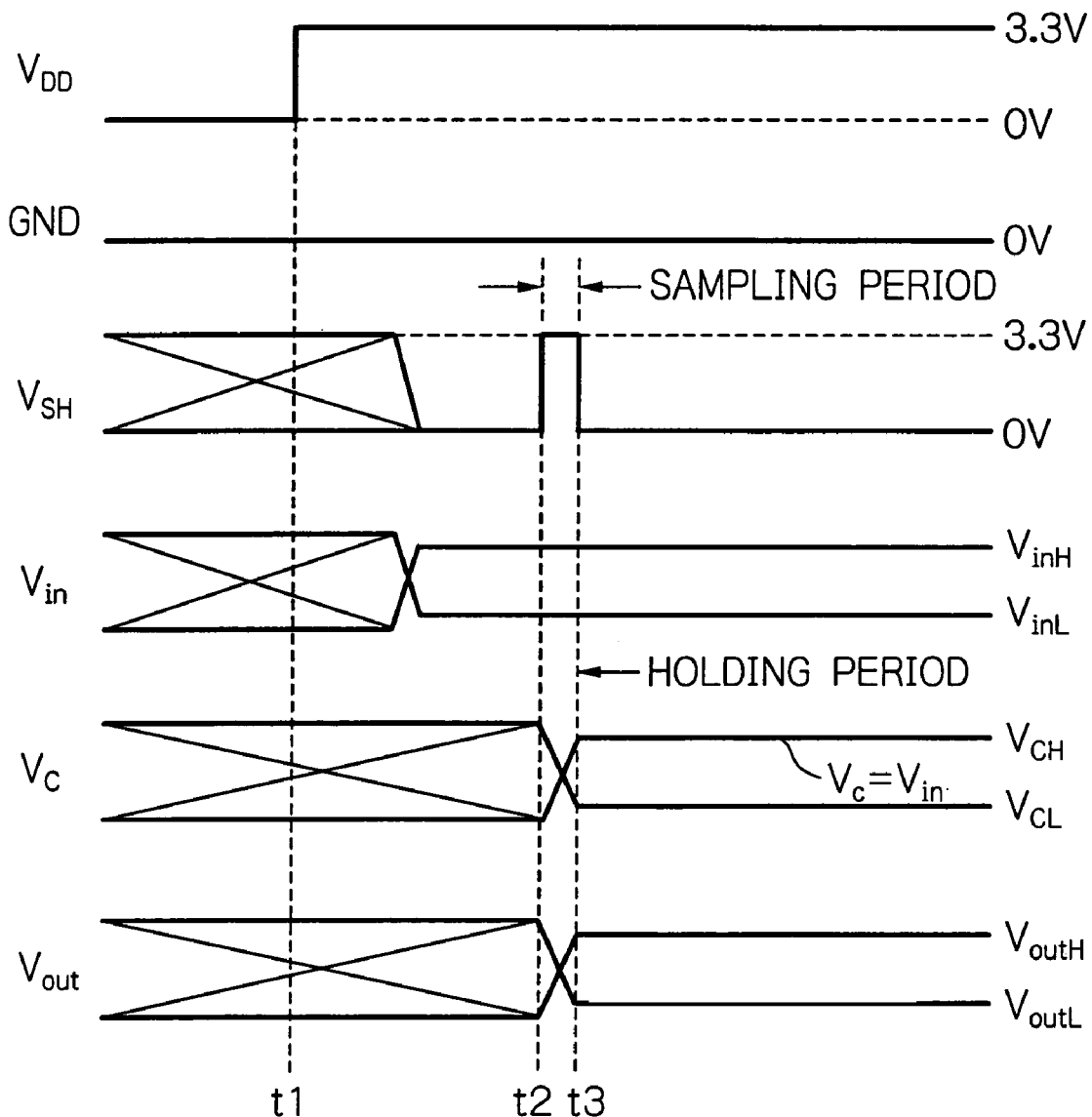
FIG. 2 is a timing diagram for explaining the operation of the sample/hold apparatus of FIG. 1.

In FIGS. 1 and 2, however, if the input voltage $V_{in}$ has a swing from 0V to 3.3V, the maximum voltage applied to the capacitor 2 is 3.3V, so that the breakdown voltage of the capacitor 2 needs to be higher than 3.3V, which would increase the electrode area thereof. As a result, the sample/hold apparatus of FIG. 1 would be increased in size.

Figure 3:
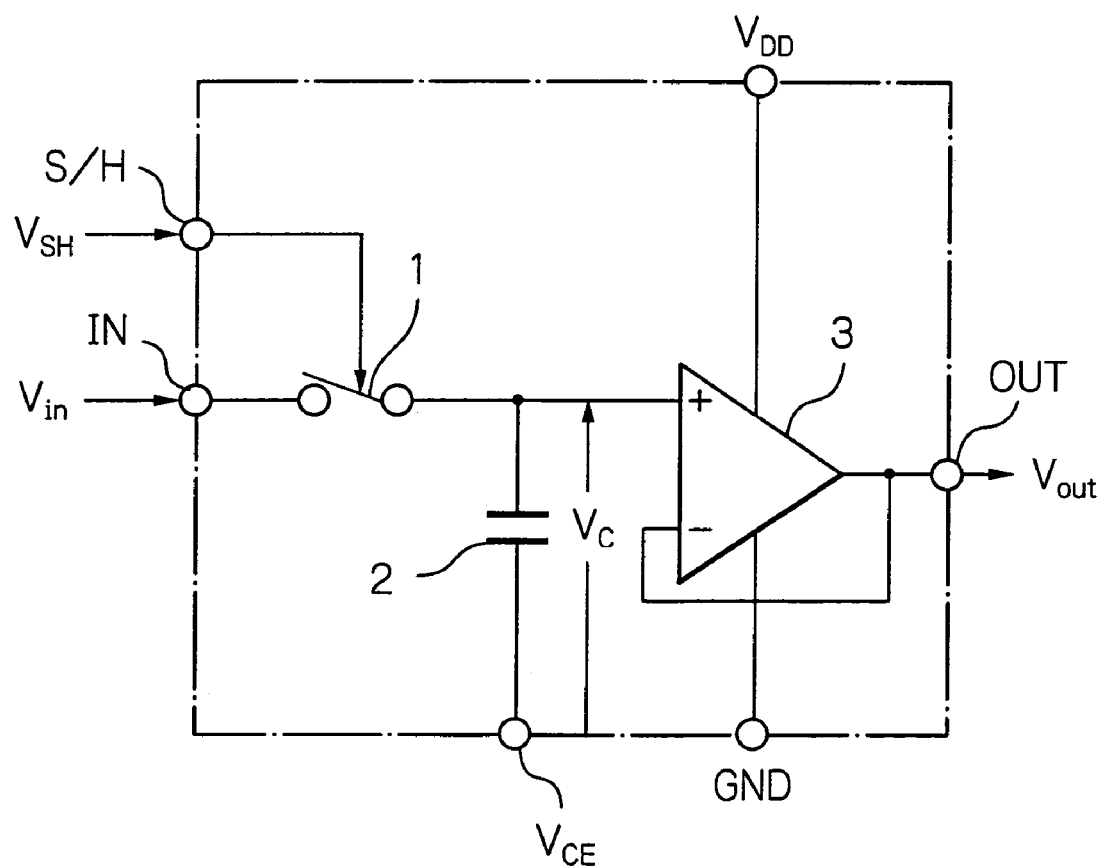
FIG. 3 is a circuit diagram illustrating a first embodiment of the sample/hold apparatus according to the present invention.

In FIG. 3, which illustrates a first embodiment of the present invention, the capacitor 2 of FIG. 1 is connected to an intermediate voltage terminal $V_{CE}$, not to the ground terminal GND. For example, an intermediate voltage such as $V_{DD}/2$ (=1.65V) is applied to the intermediate voltage terminal $V_{CE}$.

The operation of the sample/hold apparatus of FIG. 3 is explained next with reference to FIG. 4.

First, at time t0, the voltage at the intermediate voltage terminal $V_{CE}$ is powered ON, i.e., $V_{CE}$=1.65V, for example.

Note that, if the application of 1.65V to the intermediate voltage terminal $V_{CE}$ is carried out after the application of 3.3V to the power supply terminal $V_{DD}$, an input voltage $V_{in}$ having 3.3V may be applied to one terminal of the capacitor 2 while the other electrode thereof is grounded due to the infinite sample/hold voltage $V_{SH}$, so that the voltage of the capacitor 2 would exceed the breakdown voltage of 1.65V.

Next, at time t1, the voltage at the power supply terminal $V_{DD}$ is powered ON, i.e., $V_{DD}$=3.3V, for example.

Next, at time t2, the sample/hold voltage $V_{SH}$ is switched from low to high, thus entering a sampling period. That is, the sampling switching element 1 is turned ON, so that an input voltage $V_{in}$ is sampled by the capacitor 2 as a voltage $V_C$, i.e., $V_C = V_{in} - V_{CE}$. Note that the input voltage $V_{in}$ is either $V_{inL}$ or $V_{inH}$ between 0V and 3.3V, and the voltage $V_C$ is either $V_{CL}$ or $V_{CH}$ between −1.65V and 1.65V corresponding to either $V_{inL}$ or $V_{inH}$. In addition, the voltage $V_C + V_{CE}(=V_{in})$ is applied through the buffer amplifier 3 as an output voltage $V_{out}$ to the output terminal OUT. Note that the output voltage $V_{out}$ is either $V_{outL}$ or $V_{outH}$ between 0V and 3.3V corresponding to either $V_{CL}$ or $V_{CH}$.

Finally, at time t3, the sample/hold voltage $V_{SH}$ is switched from high to low, entering a holding period. That is, the sampling switching element 1 is turned OFF, so that the voltage $V_C$ is held in the capacitor 2. Thus, the buffer amplifier 3 continues to generate the output voltage $V_{out}$ at the output terminal OUT.

In FIGS. 3 and 4, if the input voltage $V_{in}$ has a swing form 0V to 3.3V, the maximum voltage applied to the capacitor 2 is 1.65V, so that the breakdown voltage of the capacitor 2 has only to be higher than 1.65V, which would decrease the electrode area thereof. As a result, the sample/hold apparatus of FIG. 3 would be decreased in size.

In FIG. 5, which illustrates a second embodiment of the present invention, a reset switching element 4 is connected between the electrodes of the capacitor 2 and is controlled by a reset voltage $V_{RST}$ at a reset terminal RST. Note that the reset switching element 4 can be constructed by MOS transistors as the sampling switching element 1.

The operation of the sample/hold apparatus of FIG. 5 is explained next with reference to FIG. 6.

Figure 6:
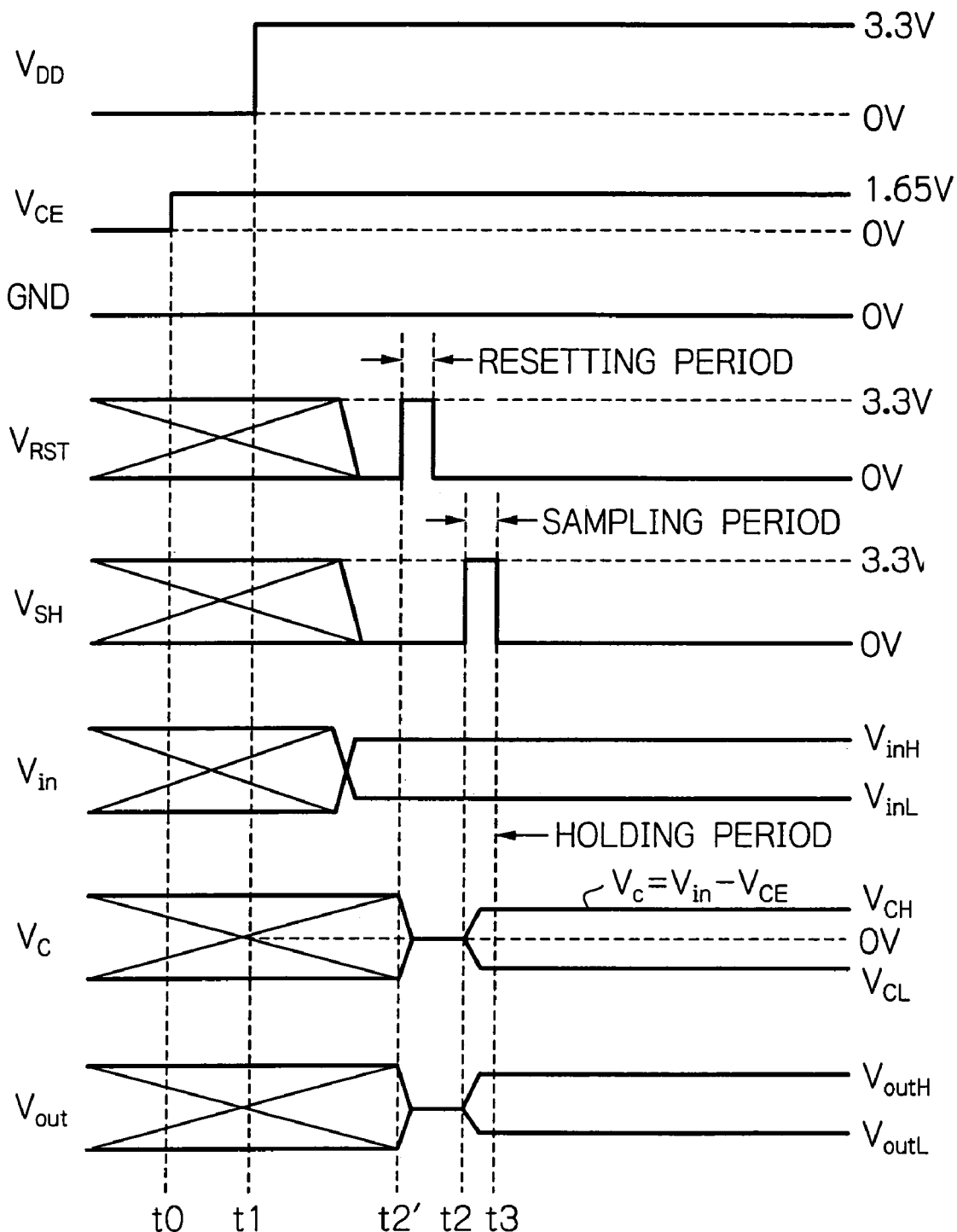
FIG. 6 is a timing diagram for explaining the operation of the sample/hold apparatus of FIG. 5.

The timing diagram of FIG. 6 is similar to that of FIG. 4. That is, at time t2' after time t1 before time t2, a reset voltage $V_{RST}$ is switched from low to high. As a result, the voltage $V_C$ at the capacitor 2 is made 0V, which would increase the changing speed of the voltage $V_C$ at time t2.

Figure 7:
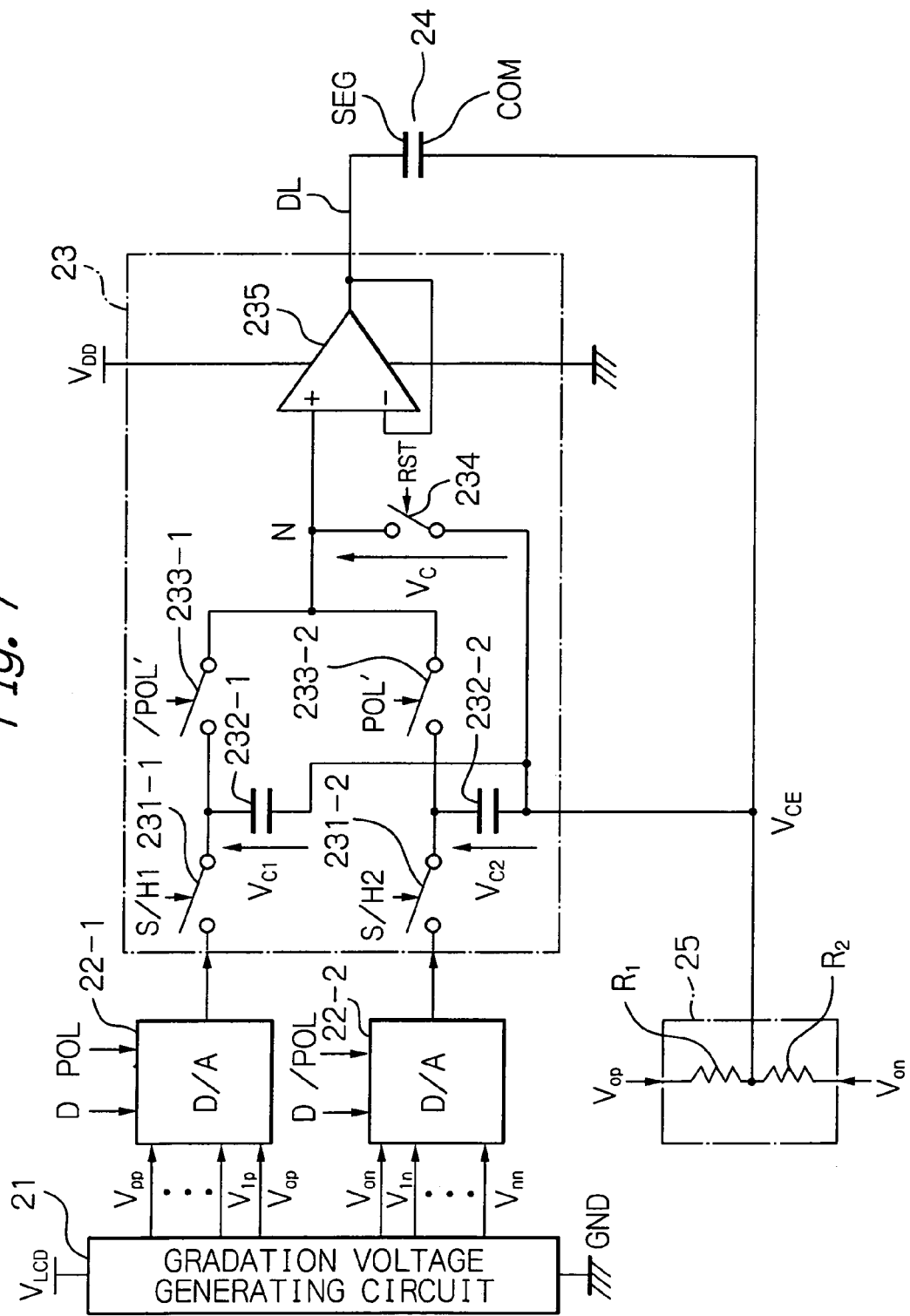
FIG. 7 is a circuit diagram illustrating a data line driver of an LCD apparatus including sample/hold circuits according to a third embodiment of the present invention.

In FIG. 7, which illustrates a data line driver of an LCD apparatus including sample/hold circuits according to a third embodiment of the present invention, a gradation voltage generating circuit 21 is constructed by a series of resistors (not shown) serving as a voltage divider for dividing a voltage between a high voltage $V_{LCD}$ and the ground voltage GND to generates gradation voltages $V_{nn}, \ldots, V_{1n}, V_{0n}, V_{0p}, V_{1p}, \ldots, V_{pp}$ ($V_{nn} < \ldots < V_{1n} < V_{0n} < V_{0p} < V_{1p} < \ldots < V_{pp}$). Here, the high voltage $V_{LCD}$ is much higher than $V_{DD}$ and can be generated by using a DC/DC converter.

The gradation voltages $V_{0p}, V_{1p}, \ldots, V_{pp}$ are transmitted to a positive-side decoder (digital/analog (D/A) converter) 22-1. On the other hand, the gradation voltages $V_{0n}, V_{1n}, \ldots, V_{nn}$ are transmitted to a negative-side decoder (D/A converter) 22-2.

The positive-side decoder 22-1 selects one of the gradation voltages $V_{0p}, V_{1p}, \ldots, V_{pp}$ in accordance with a video data signal D in response to a polarity signal POL. On the other hand, the negative-side decoder 22-2 selects one of the gradation voltages $V_{0p}, V_{1p}, \ldots, V_{pp}$ in accordance with the video data signal D in response to a polarity signal /POL.

The selected gradation voltage is applied via a sample/hold circuit 23 to a data line DL which is connected to a segment electrode SEG of a liquid crystal panel 24. Note that there are generally a plurality of segment electrodes in the liquid crystal panel 24; however, in order to simplify the description, only one segment is illustrated.

Also, a voltage divider 25 is provided to divide a voltage between the gradation voltages $V_{0p}$ and $V_{0n}$ to generate an intermediate voltage $V_{CE}$ which is equal to $(V_{0p}+V_{0n})/2$, for example. The intermediate voltage $V_{CE}$ is applied to the sample/hold circuit 23 as well as a common electrode COM of the liquid crystal panel 24.

The polarity signal POL and /POL opposite in phase to each other are changed according to the inversion driving method. For example, in order to avoid a so-called residual image phenomenon, the polarity signals POL and /POL are inverted with respect to the voltage at the common electrode COM for every frame, which is called a frame inversion driving method. Also, in order to avoid the flicker due to the frame inversion driving method, a horizontal inversion driving method, a vertical inversion driving method or a dot inversion driving method is carried out. In the horizontal line inversion driving method, the polarity signals POL and /POL are inverted with respect to the voltage at the common electrode COM for every scan line. Also, in the vertical line inversion driving method, the polarity signals POL and /POL are inverted with respect to the voltage at the common electrode COM for every data line. Further, in the dot inversion driving method, the polarity signals POL and /POL are inverted for every dot (video signal).

The sample/hold circuit 23 of FIG. 7 will be explained next in detail.

The sample/hold circuit 23 is constructed by a sample switching element 231-1 for receiving the gradation voltage selected by the positive-side decoder 22-1, a sample switching element 231-2 for receiving the gradation voltage selected by the negative-side decoder 22-2, a capacitor 232-1 connected between the sampling switching element 231-1 and the voltage divider 25, a capacitor 232-2 connected between the sampling switching element 231-2 and the voltage divider 25, a transfer switching element 233-1 connected between the first terminal of the capacitor 232-1 and a node N, a transfer switching element 233-2 connected between the first terminal of the capacitor 232-2 and the node N, a reset switching element 234 connected between the node N and the voltage divider 25, and a buffer amplifier 235 connected between the node N and the data line DL.

The sampling switching elements 231-1 and 231-2 are controlled by sample/hold signals S/H1 and S/H2, respectively.

The transfer switching elements 233-1 and 233-2 are controlled by signals/POL' and POL' which are synchronized with the polarity signals/POL and POL, respectively.

The reset switching element 234 is controlled by a reset signal RST in synchronization with rising and falling edges of the polarity signals POL and/POL.

The video data signal D, the polarity signals POL and/POL, the sample/hold signals S/H1 and S/H2, and the reset signal RST are generated from a controller (not shown).

Figure 8:
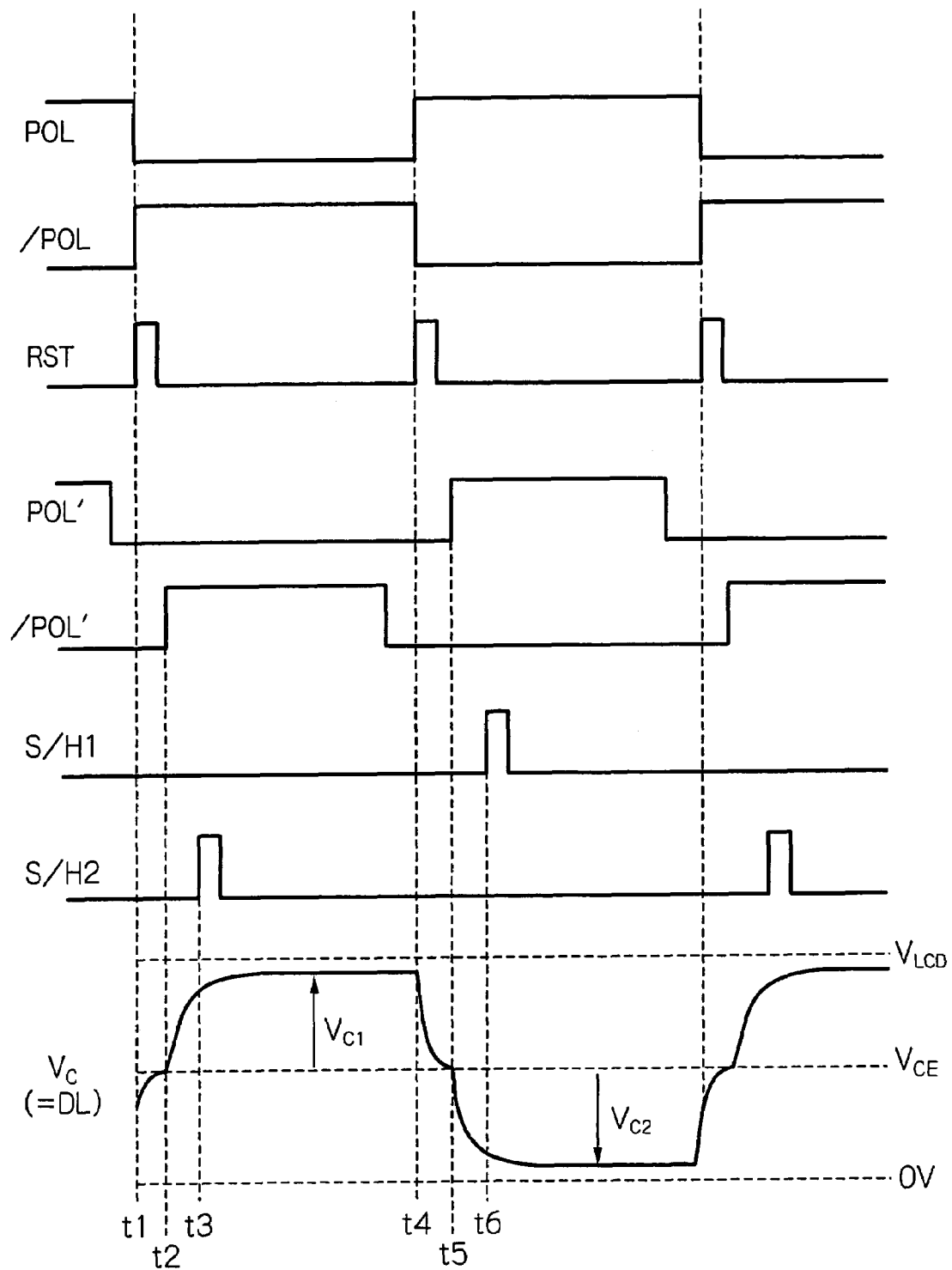
FIG. 8 is a timing diagram for explaining the operation of the data line driver of FIG. 7.

The data line driver of FIG. 7 is explained next with reference to FIG. 8.

First, at time t1, the reset signal RST is made to be high in synchronization with rising and falling edges of the polarity signals POL and/POL. As a result, the reset switching element 234 is turned ON, so that the voltage $V_C$ at the node N is made to be $V_{CE}$.

Next, at time t2, the signal/POL' is made to be high, so that the transfer switching element 233-1 is turned ON. As a result, the first terminal of the capacitor 232-1 is connected to the node N. Therefore, the voltage $V_{C1}$ at the first terminal of the capacitor 232-1 is transferred to the node N to increase the voltage $V_C$ thereof.

Next, at time t3, the sample/hold signal S/H2 is made to be high, so that the sampling switching element 231-2 is turned ON. As a result, the capacitor 232-2 is discharged by the gradation voltage selected by the negative-side decoder 22-2 to decrease the voltage $V_{C2}$ at the first terminal of the capacitor 232-2, i.e., since the transfer switching element 233-2 is turned OFF.

Next, at time t4, the reset signal RST is again made to be high in synchronization with rising and falling edges of the polarity signals POL and/POL. As a result, the reset switching element 234 is turned ON, so that the voltage $V_C$ at the node N is made to be $V_{CE}$.

Next, at time t5, the signal POL' is made to be high, so that the transfer switching element 233-2 is turned ON. As a result, the first terminal of the capacitor 232-2 is connected to the node N. Therefore, the voltage $V_{C2}$ at the first terminal of the capacitor 232-2 is transferred to the node N to decrease the voltage thereof.

Next, at time t6, the sample/hold signal S/H1 is made to be high, so that the sampling switching element 231-1 is turned ON. As a result, the capacitor 232-1 is charged by the gradation voltage selected by the positive-side decoder 22-1 to increase the voltage at the first terminal of the capacitor 232-1, since the transfer switching element 233-1 is turned OFF.

Note that the voltage at the data line DL is substantially the same as the voltage $V_C$ at the node N.

Also, the reset switching element 234 can be deleted, although the operation speed would be decreased.

The voltage $V_C$ at the node N is swung from 0V to $V_{LCD}$; however, the voltage $V_{C1}$ applied to the capacitor 232-1 is substantially swung from $V_{CE}$ to $V_{LCD}$ and the voltage $V_{C2}$ applied to the capacitor 232-2 is substantially swung from 0V to $V_{CE}$. In other words, the amplitude of each of the voltages $V_{C1}$ and $V_{C2}$ applied to the capacitors 232-1 and 232-2 is substantially half of the amplitude of the voltage $V_C$. Therefore, the breakdown voltages of the capacitors 232-1 and 232-2 can be halved to decrease the occupied areas thereof. For example, if the occupied area of the capacitors 232-1 and 232-2 is about 20 percent of that of the entire data line driver, the area of the entire data line driver can be decreased to about 90 percent (=100−20/2) by halving the occupied area of the capacitors 232-1 and 232-2.

As explained hereinabove, according to the present invention, the occupied area can be decreased to enhance the integration.

The invention claimed is:

1. A data line driver for driving a data line in a liquid crystal display apparatus comprising:
    a gradation voltage generating circuit adapted to generate a plurality of positive-side voltages and a plurality of negative-side voltages;
    a positive-side decoder adapted to select one of said positive-side voltages in accordance with a video data signal in response to a first polarity signal;
    a negative-side decoder adapted to select one of said negative-side voltages in accordance with said video data signal in response to a second polarity signal;
    a sample/hold circuit connected to said positive-side decoder, said negative-side decoder and said data line, said sample/hold circuit selectively sampling and holding output signals of said positive-side decoder and said negative-side decoder; and
    an intermediate voltage generating circuit connected to said sample/hold circuit, said intermediate voltage generating circuit being adapted to generate an intermediate voltage among said positive-side voltages and said negative-side voltages;
    said sample/hold circuit comprising:
    a first sampling switching element connected to the output of said positive-side decoder, said first sampling switching element being adapted to sample the selected one of said positive-side voltages in response to a first sample/hold signal;
    a second sampling switching element connected to the output of said negative-side decoder, said second sampling switching element being adapted to sample the selected one of said negative-side voltages in response to a second sample/hold signal;
    a first capacitor connected between an output of said first sampling switching element and an output of said intermediate voltage generating circuit;
    a second capacitor connected between an output of said second sampling switching element and the output of said intermediate voltage generating circuit;
    a first transfer switching element connected between the output of said first sampling switching element and a node, said first transfer switching element being turned ON in response to a first control signal analogous to said second polarity signal;
    a second transfer switching element connected between the output of said second sampling switching element and said node, said second transfer switching element being turned ON in response to a second control signal analogous to said first polarity signal; and
    a buffer amplifier connected between said node and said data line.

2. The data line driver as set forth in claim 1 further comprising a reset switching element connected between said node and the output of said intermediate voltage generating circuit, said reset switching element being turned ON in response to a reset signal generated at rising and falling edges of said first and second polarity signals.

3. The data line driver as set forth in claim 1, wherein said intermediate voltage generating circuit comprises a voltage divider for receiving a minimum one of said positive-side voltages and a maximum one of said negative-side voltages.

4. The data line driver as set forth in claim 3, wherein said voltage divider includes a series of two resistors whose values are the same.

5. The data line driver as set forth in claim 1, wherein said intermediate voltage is applied to a common electrode of said liquid crystal display apparatus.

* * * * *